United States Patent
Kelly et al.

(10) Patent No.: US 10,134,871 B2
(45) Date of Patent: Nov. 20, 2018

(54) DOPING OF HIGH-K DIELECTRIC OXIDE BY WET CHEMICAL TREATMENT

(71) Applicant: Taiwan Semiconductor Manufacturing Company, Ltd., Hsin-Chu (TW)

(72) Inventors: Andrew Joseph Kelly, Hsin-Chu (TW); Yusuke Oniki, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/581,422

(22) Filed: Dec. 23, 2014

(65) Prior Publication Data

US 2016/0181108 A1    Jun. 23, 2016

(51) Int. Cl.
*H01L 29/66* (2006.01)
*H01L 29/51* (2006.01)
*H01L 21/28* (2006.01)

(52) U.S. Cl.
CPC .. *H01L 29/66545* (2013.01); *H01L 21/28185* (2013.01); *H01L 21/28194* (2013.01); *H01L 21/28229* (2013.01); *H01L 29/513* (2013.01); *H01L 29/517* (2013.01)

(58) Field of Classification Search
CPC ......... H01L 21/28158; H01L 29/66545; H01L 21/28185; H01L 21/228; H01L 29/511; H01L 29/513–29/518; H01L 21/28176; H01L 21/28194; H01L 29/785–29/7854; H01L 29/7856; H01L 29/7857; H01L 29/4236; H01L 29/42364
See application file for complete search history.

(56) References Cited

U.S. PATENT DOCUMENTS

| | | | |
|---|---|---|---|
| 3,789,023 A * | 1/1974 | Ritchie | H01L 21/00 148/DIG. 118 |
| 5,330,922 A * | 7/1994 | Erdeljac | H01L 21/8249 148/DIG. 13 |
| 7,425,740 B2 | 9/2008 | Liu et al. | |
| 7,432,548 B2 * | 10/2008 | Forbes | H01L 21/0228 257/325 |
| 7,799,669 B2 * | 9/2010 | Ramin | H01L 21/28176 438/199 |
| 7,915,112 B2 * | 3/2011 | Xu | H01L 21/823807 257/369 |
| 8,048,723 B2 | 11/2011 | Chang et al. | |
| 8,053,299 B2 | 11/2011 | Xu | |
| 8,183,627 B2 | 5/2012 | Currie | |
| 8,415,718 B2 | 4/2013 | Xu | |
| 8,497,177 B1 | 7/2013 | Chang et al. | |
| 8,609,518 B2 | 12/2013 | Wann et al. | |

(Continued)

*Primary Examiner* — Xinning Niu
*Assistant Examiner* — Sean Hagan
(74) *Attorney, Agent, or Firm* — Haynes and Boone, LLP (57) ABSTRACT

A method for fabricating a semiconductor device includes forming a first high-k (HK) dielectric layer over a substrate, performing a wet treatment process to the first HK dielectric layer. The wet treatment includes a dopant. The method also includes performing an annealing process to the first HK dielectric layer such that the dopant diffuses into the first HK dielectric layer to form a modified HK dielectric layer. Therefore the modified HK dielectric layer has a second dielectric constant which is different than the first dielectric constant.

20 Claims, 9 Drawing Sheets

(56) References Cited

U.S. PATENT DOCUMENTS

| | | |
|---|---|---|
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 2003/0057432 A1* | 3/2003 | Gardner ............ H01L 21/28185 257/100 |
| 2004/0029321 A1* | 2/2004 | Ang ................ H01L 21/28185 438/142 |
| 2007/0049014 A1* | 3/2007 | Chen ................ H01L 21/26506 438/649 |
| 2008/0210158 A1* | 9/2008 | Munzer ............... H01L 21/6715 118/258 |
| 2010/0127336 A1* | 5/2010 | Chambers ......... H01L 21/28088 257/369 |
| 2011/0115027 A1* | 5/2011 | Jagannathan ..... H01L 21/28088 257/369 |
| 2013/0072004 A1* | 3/2013 | Tsuchiko ............ H01L 21/8222 438/492 |
| 2013/0285153 A1 | 10/2013 | Lee et al. |
| 2013/0330906 A1* | 12/2013 | Yu ..................... H01L 29/66795 438/424 |
| 2014/0183600 A1 | 7/2014 | Huang et al. |
| 2014/0264590 A1 | 9/2014 | Yu et al. |
| 2014/0264592 A1 | 9/2014 | Oxland et al. |

\* cited by examiner

DOPING OF HIGH-K DIELECTRIC OXIDE BY WET CHEMICAL TREATMENT

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

When a semiconductor device such as a metal-oxide-semiconductor field-effect transistor (MOSFET) is scaled down through various technology nodes, high-k (HK) dielectric material and metal are adopted to form a gate stack. Although existing methods of fabricating IC devices have been generally adequate for their intended purposes, they have not been entirely satisfactory in all respects. For example, challenges rise to develop robust processes for increasing dielectric constant of a HK gate dielectric layer.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices. The following disclosure will continue with a FinFET example to illustrate various embodiments of the present invention. It is understood, however, that the application should not be limited to a particular type of device, except as specifically claimed.

Figure 1:
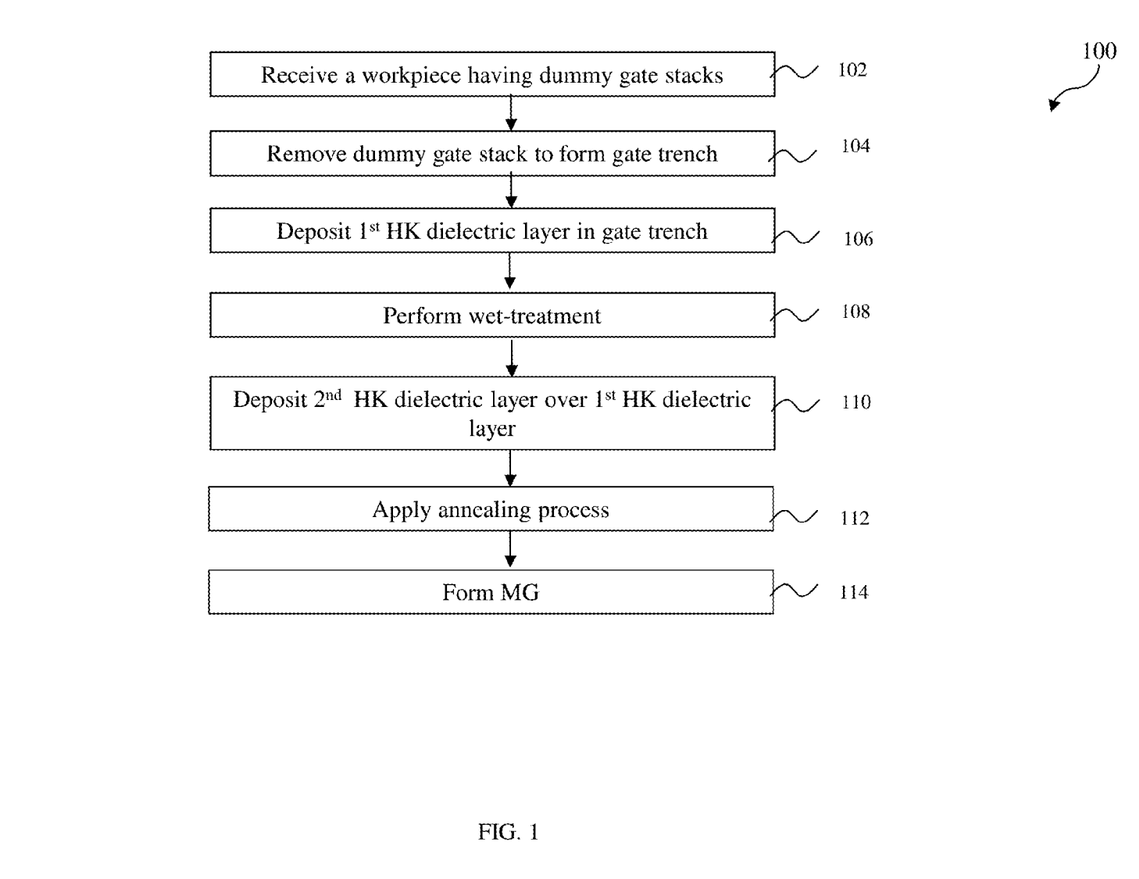
FIG. 1 is a flowchart of an example method for fabricating a semiconductor device constructed in accordance with some embodiments.

FIG. 1 is a flowchart of a method 100 of fabricating one or more semiconductor devices in accordance with some embodiments. The method 100 is discussed in detail below, with reference to a semiconductor device 200, shown in FIGS. 2A and 2B-8.

Figure 2A:
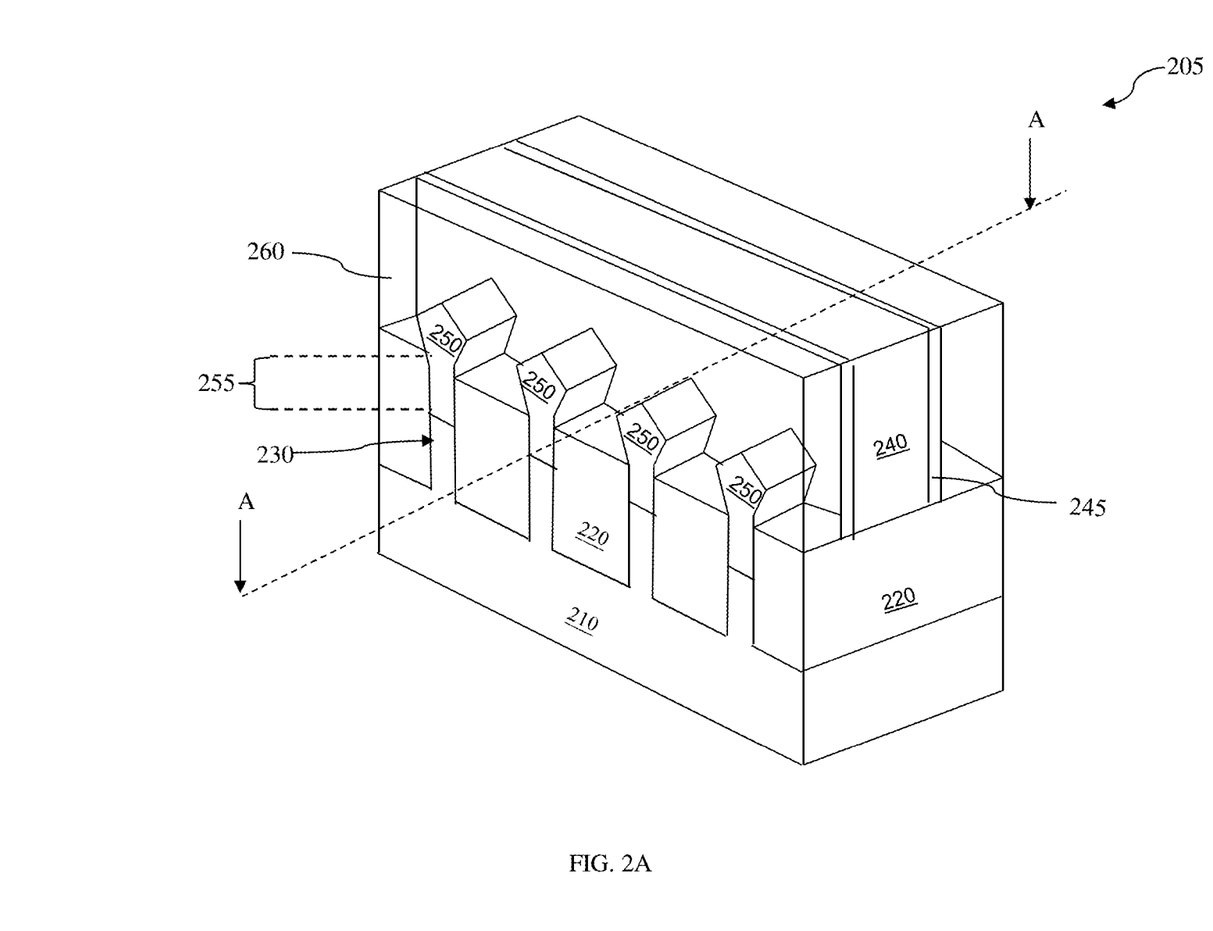
FIG. 2A is a diagrammatic perspective view of an example of a work piece of a semiconductor device in accordance with some embodiments.
Figure 2B:
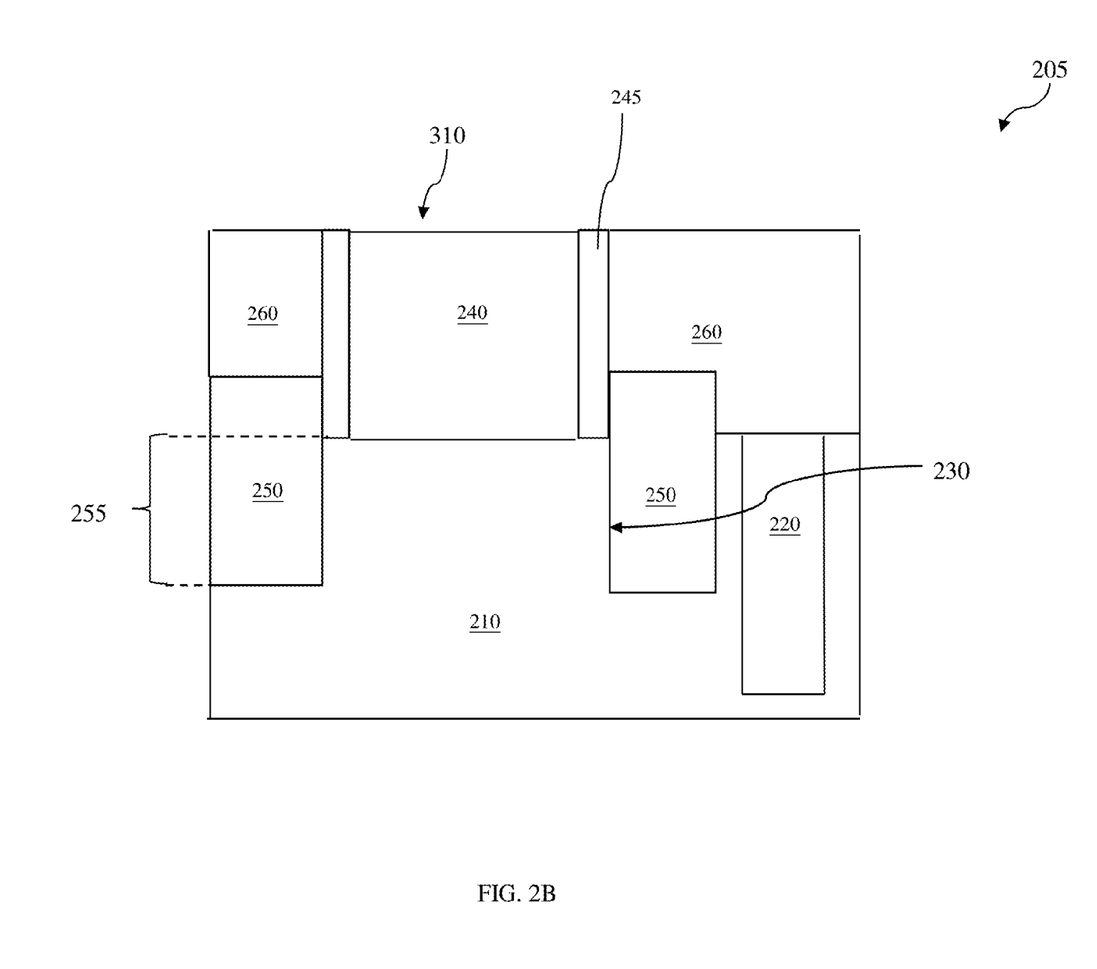
FIG. 2B is a cross-sectional view of an example of a work piece of a semiconductor device along the line A-A in FIG. 2A.

Referring to FIGS. 1, 2A, and 2B, the method 100 starts at step 102 by receiving a workpiece 205 of the semiconductor device 200. The workpiece 205 includes a substrate 210. The substrate 210 may be a bulk silicon substrate. Alternatively, the substrate 210 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor device 200, the insulator layer is a component (e.g., layer) of a silicon-on-insulator substrate.

The substrate 210 may also include various doped regions. The doped regions may be doped with p-type dopants, such as boron or $BF_2$; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

The substrate 210 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The workpiece 205 also includes a plurality of fin features 230 formed over the substrate 210. The fin feature 230 may include Si, SiGe, silicon germanium tin (SiGeSn), GaAs, InAs, InP, or other suitable materials. In some embodiments, the fin feature 230 is formed by any suitable process including various deposition, photolithography, and/or etching processes. As an example, the fin feature 230 is formed by patterning and etching a portion of the substrate 210.

The workpiece 205 also includes a plurality of gate stacks 240 over the substrate 210, including wrapping over a portion of the fin features 230. In the present embodiment, the gate stack 240 is a dummy gate stack, which will be replaced later by high-k/metal gate (HK/MG). The dummy gate stack 240 may include a dielectric layer, a polysilicon layer. The dummy gate stack 240 may be formed by any suitable process or processes, such as deposition, patterning and etching.

Sidewall spacers 245 are formed along the sidewalls of the dummy gate stack 240. The sidewall spacers 245 may include a dielectric material such as silicon oxide. Alternatively, the sidewall spacers 245 may include silicon nitride, silicon carbide, silicon oxynitride, or combinations thereof. The sidewall spacers 245 may be formed by depositing a gate sidewall spacer layer and then anisotropic dry etching the gate sidewall spacer layer, known in the art.

The workpiece 205 also includes source/drain (S/D) features 250 over the substrate 210, beside the dummy gate stack 240 (with the sidewall spacers 245). In some embodiments, the source/drain feature 250 is a source feature, and another source/drain feature 250 is a drain feature. The source/drain features 250 are separated by the dummy gate stack 240. In one embodiment, a portion of the fin feature 230, beside the dummy gate stack 240 is recessed to form S/D recesses 255 and then the S/D features 250 are formed over the S/D recesses 255 by epitaxial growing processes, including chemical vapor deposition (CVD) deposition techniques (e.g., vapor-phase epitaxy (VPE) and/or ultra-high vacuum CVD (UHV-CVD)), molecular beam epitaxy, and/or other suitable processes. The S/D features 250 may include Ge, Si, GaAs, aluminum gallium arsenide (AlGaAs), SiGe, gallium arsenide phosphide (GaAsP), GaSb, InSb, indium gallium arsenide (InGaAs), InAs, or other suitable materials. After the S/D recesses 255 are filled with the S/D feature 250, further epitaxial growth of a top layer of the S/D features 250 expands horizontally and facets may start to form, such as a diamond shape facets. The S/D features 250 may be in-situ doped during the epi processes. For example, in one embodiment, the S/D feature 250 includes an epitaxially grown SiGe layer that is doped with boron. In another embodiment, the S/D feature 250 includes an epitaxially grown Si epi layer that is doped with carbon. In yet another embodiment, the S/D feature 250 includes an epitaxially grown Si epi layer that is doped with phosphorous.

In one embodiment, the S/D feature 250 is not in-situ doped, an implantation process (i.e., a junction implant process) is performed to dope the S/D feature 250. One or more annealing processes may be performed to activate dopants. The annealing processes comprise rapid thermal annealing (RTA) and/or laser annealing processes.

The workpiece 205 also includes an interlayer dielectric (ILD) layer 260 deposited over the substrate 210, including between/over each of the dummy gate stack 240 and over the S/D features 250. The ILD layer 260 may be deposited by CVD, atomic layer deposition (ALD), spin-on coating, or other suitable techniques. The ILD layer 260 may include silicon oxide, silicon nitride, oxynitride, a dielectric material having a dielectric constant (k) lower than thermal silicon oxide (therefore referred to as low-k dielectric material layer), and/or other suitable dielectric material layer. The ILD layer 260 may include a single layer or multiple layers. A CMP may be performed to polish back the ILD layer 260 to expose a top surface of the dummy gate stack 240.

Figure 3:
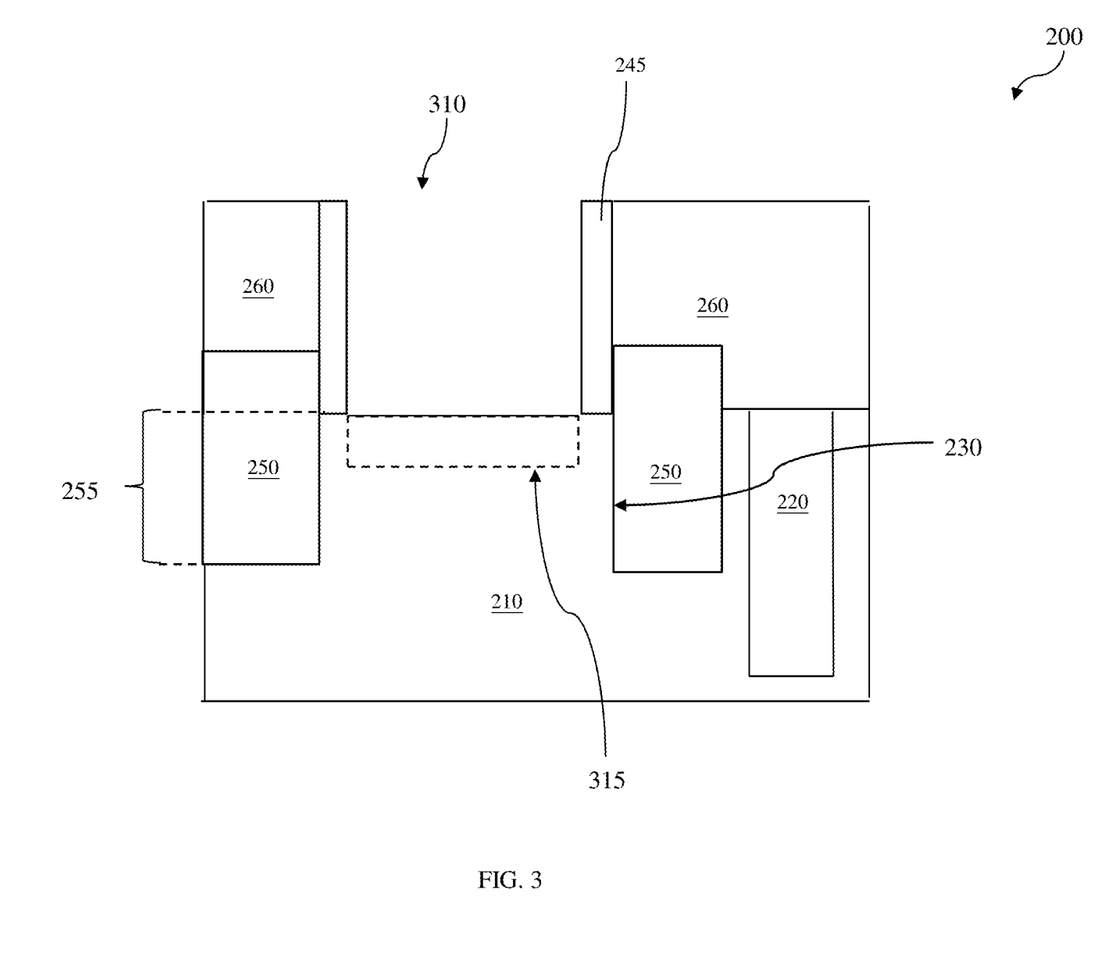
FIGS. 3 to 8 are cross-sectional views of an example semiconductor device in accordance with some embodiments, along the line A-A in FIG. 2A.

Referring to FIGS. 1 and 3, once the workpiece 205 is received, the method of 100 proceeds to step 104 by removing the dummy gate stack 240 to form a gate trench 310. In some embodiments, the etching processes may include selective wet etch or selective dry etch, such that having an adequate etch selectivity with respect to the fin feature 230, the sidewall spacer 245 and the ILD layer 260. In one embodiment, a selective wet etching solution includes a tetramethylammonium hydroxide (TMAH), a $HF/HNO_3/CH_3COOH$ solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. In another example a dry etching processes include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching). Alternatively, the dummy gate stacks 240 may be removed by a series of processes including photolithography patterning and etching back.

In the present embodiment, a portion of the fin feature 230 is exposed in the gate trenches 310, where a gate channel is to be formed and therefore it is referred to as a channel region 315. The channel region 315 disposed between the S/D features 250. The flow of carriers (electrons for the n-channel device and holes for the p-channel device) through the channel region 315 is controlled by a voltage applied to a gate stack to be formed adjacent to and overwrapping the channel region 315.

Figure 4:
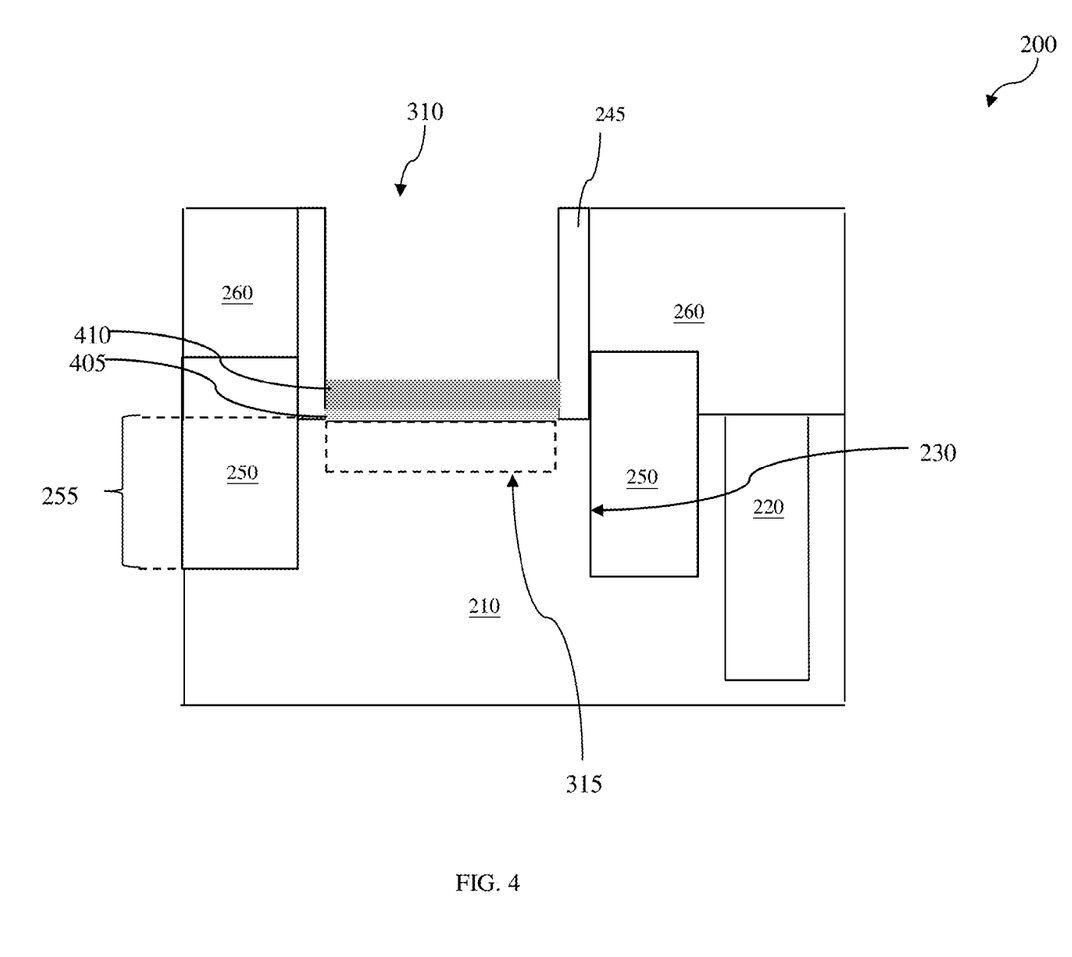

Referring to FIGS. 1 and 4, the method 100 proceeds to step 106 by depositing a first gate dielectric layer 410 over the substrate 210, including wrapping over the exposed fin feature 230 (the channel region 315) in the gate trench 310. In some embodiments, prior to depositing the first HK dielectric layer, an interfacial layer (IL) 405 is deposited over the exposed fin feature 230 first by a suitable method, such as atomic layer deposition (ALD), CVD, thermal oxidation or ozone oxidation. The IL 405 may include oxide, HfSiO and oxynitride. The gate dielectric layer 410 is then deposited over the IL 405. In the present embodiment, the gate dielectric layer 410 includes a dielectric material layer having a high dielectric constant (HK dielectric layer-greater than that of the thermal silicon oxide in the present embodiment). The first HK dielectric layer 410 is deposited over the IL 405 by a suitable technique, such as ALD, CVD, metal-organic CVD (MOCVD), physical vapor deposition (PVD), other suitable technique, or a combination thereof. The first HK dielectric layer 410 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, $HfO_2$, LaSiO, AlSiO, HfTaO, HfTiO, $(Ba,Sr)TiO_3$ (BST), $Al_2O_3$, $Si_3N_4$, oxynitrides (SiON), or other suitable materials. The first HK dielectric layer 410 has a first dielectric constant $k_1$.

To increase a dielectric constant of the HK gate dielectric layer, several approaches have been attempted. For example, performing an implantation process to introduce a dopant to the HK gate dielectric film. But the implantation doping process may induce channel region damage due to its physical bombardment and charging damage. For another example, an in-situ dopant film deposition is employed into the HK gate dielectric film deposition process by alternating a HK gate dielectric film deposition cycle and a dopant film deposition cycle. But a low dopant is difficult to achieve due to a minimum thickness exists in each dopant film deposition cycle. Also cross-reaction between precursors of a HK gate dielectric film deposition process and a dopant film deposition process brings constrains. The present disclosure provides a wet doping process to increase dielectric constant of the HK gate dielectric film.

Figure 5:
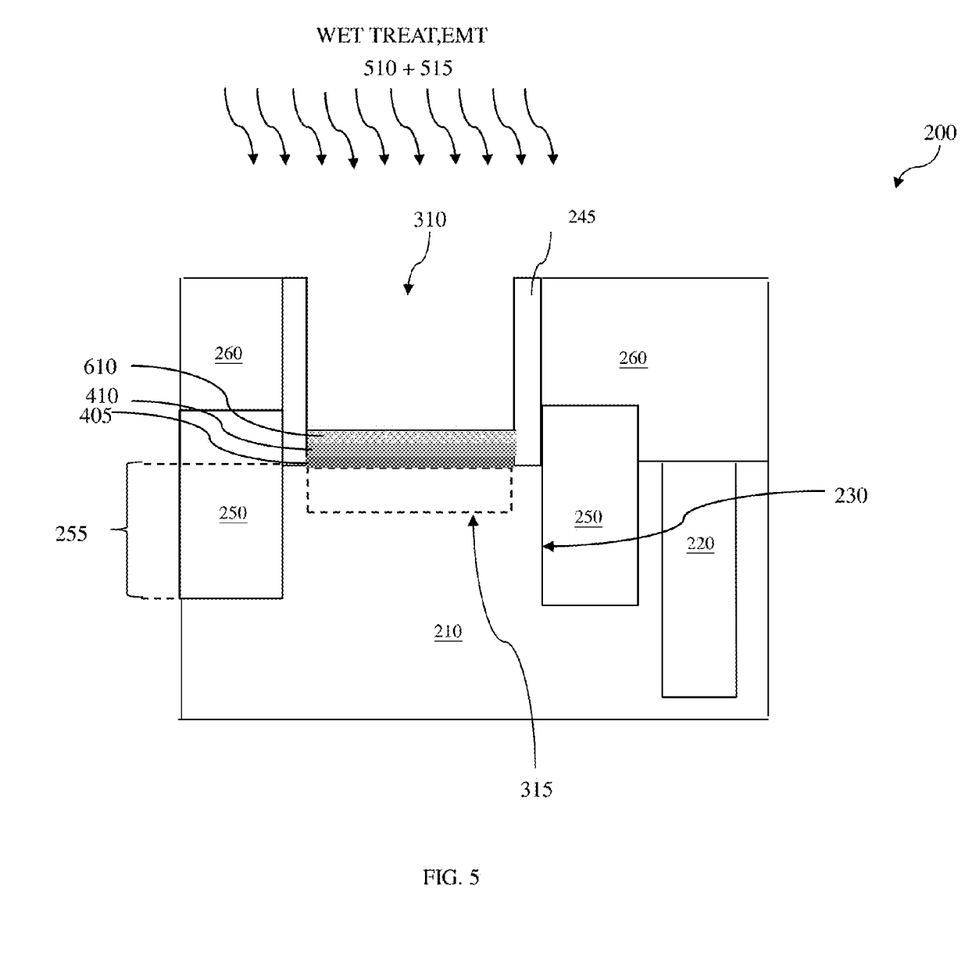

Referring to FIGS. 1 and 5, the method 100 proceeds to step 108 by performing a wet-treatment to the first HK dielectric layer 410. The wet-treatment may be performed in a wet station or in a chamber. The wet-treatment may be performed in a batch mode or in a single wafer mode. In the present embodiment, the wet-treatment is performed such that a chemical solution 510 carrying a dopant 515 is applied to the first HK dielectric layer 410. The dopant 515 is then absorbed by the first HK dielectric layer 410 to form a dopant absorption layer 610 as an upper portion of the first HK dielectric layer 410.

The dopant 515 may include $AlCl_3$, $Al(OH)_3$, $Al_2(SO4)_3$, $Al(NO_3)_3$, yttrium (Y), lanthanum (La), gadolinium (Gd), and/or other suitable dopant materials. The chemical solution 510 may include de-ionized water (DIW), isopropyl alcohol (IPA), organic solvents, and/or other suitable solutions. For example, the dopant $Al(OH)_3$ is carried by the IPA solution 515. For another example, a dopant $AlCl_3$ 515 is carried by propylene carbonate. In one embodiment, the dopant Al 515 in acidic solution 510 is absorbed onto a surface of the first $HfO_2$ layer 410 to form the dopant absorption layer 610. It is believed that during the wet-treatment, a chemical $HfO_2$ layer with hydroxyl groups is formed on the surface of the first $HfO_2$ layer 410. The dopant Al 515 substitutes hydrogen from hydroxyl surface group. In another embodiment, the dopant Al 515 in an alkaline solution 510 is absorbed onto a surface of the first $HfO_2$ layer 410 to form the dopant absorption layer 610. In this case, it is believed that the hydroxyl is dissociated and replaced by Al(OH).

The chemical solution 510 (carrying the dopant 515) may be applied to the first HK dielectric layer 410 by spraying (or otherwise dispensing) it onto the first HK dielectric layer 410 through a nozzle of a chemical solution container in a process chamber. In some embodiments, the substrate 210 is being rotated (e.g., spun about a central axis of the substrate 210) while the chemical solution 510 (carrying the dopant 515) is sprayed onto the first HK dielectric layer 410. The substrate 210 may be rotated in a range from 100 rpm to 4000 rpm, by way of example. In some embodiments, the substrate 210 is heated by a stage that holds the substrate 210. Heating the substrate 210 may provide benefits such as enhancing dopant absorption in the first HK dielectric layer 410. In some embodiments, a temperature of the chemical solution 510 is chosen in a range from about 30° C. to about 250° C.

In the present embodiment, an absorbed dopant concentration in the absorption layer 610 may be adjusted by process parameters such as a concentration of the dopant 515, the pH value of the chemical solution and time duration of applying the wet treatment. In some embodiment, a concentration of the dopant 515 in the chemical solution 510 may be chosen in a range from about 0.01 parts per billion (ppb) to about 10000 ppb by weight (or mass). Thus, a low dopant (e.g. <5%) of the absorption layer 610 is feasible.

In some embodiments, other processes may interpose the wet-treatment such as, for example, rinse process (es), dry process (es), and additional fabrication processes that form one or more features on surfaces of the substrate 210. In some embodiments, an oxidizer (e.g. hydrogen peroxide) is applied to oxidize the dopant absorption layer 610 to enhance adhesion between the dopant absorption layer 610 and a subsequent layer to be deposited over the dopant absorption layer 610.

Figure 6:
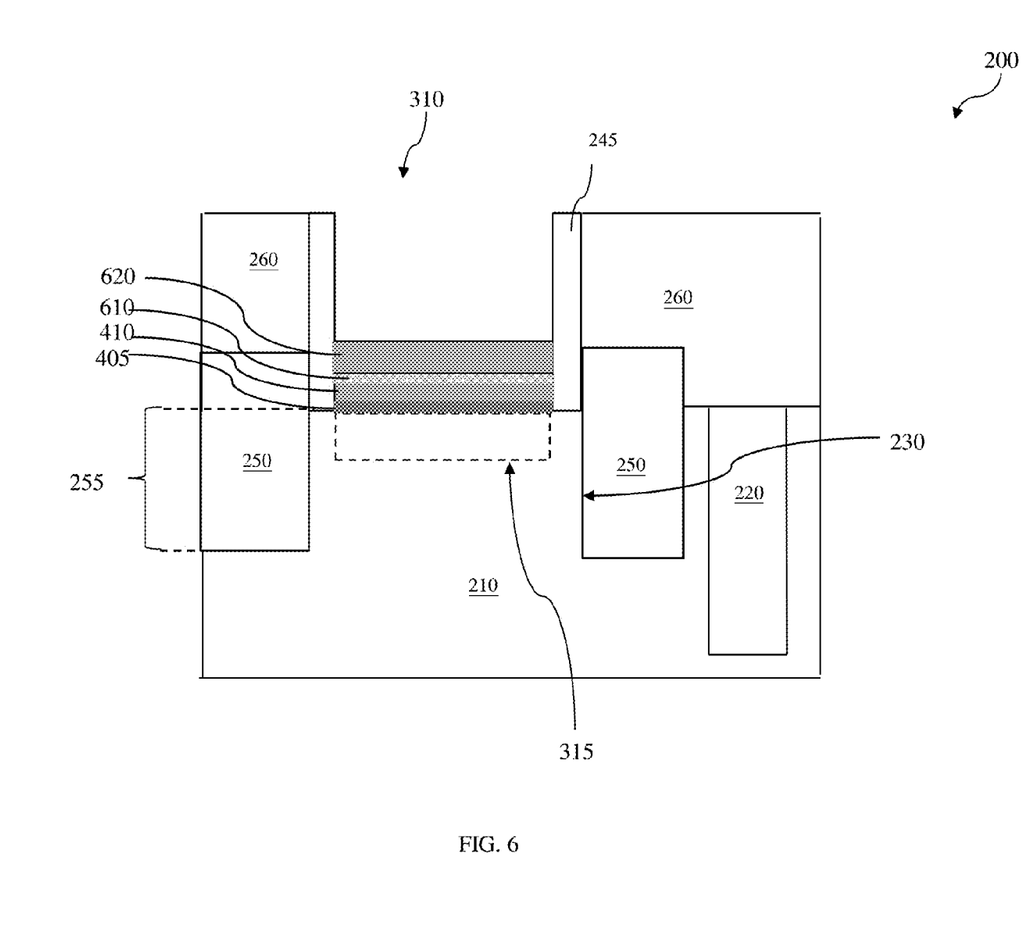

Referring to FIGS. 1 and 6, the method 100 proceeds to step 110 by depositing a second HK layer 620 over the first HK dielectric layer 410 (having the dopant absorption layer 610) in the gate trench 310. The second HK layer 620 is formed similarly in many respects to the first HK dielectric layer 410 discussed above in association with FIG. 4. In some embodiments, the second HK layer 620 is formed of the same material as the first HK dielectric layer 410. In some embodiments, the second HK layer 620 is formed of a different material than the first HK dielectric layer 410. In some embodiments, the first and second HK layers, 410 and 620, have a different film thickness. The second HK dielectric layer 620 has a second dielectric constant $k_2$.

Figure 7:
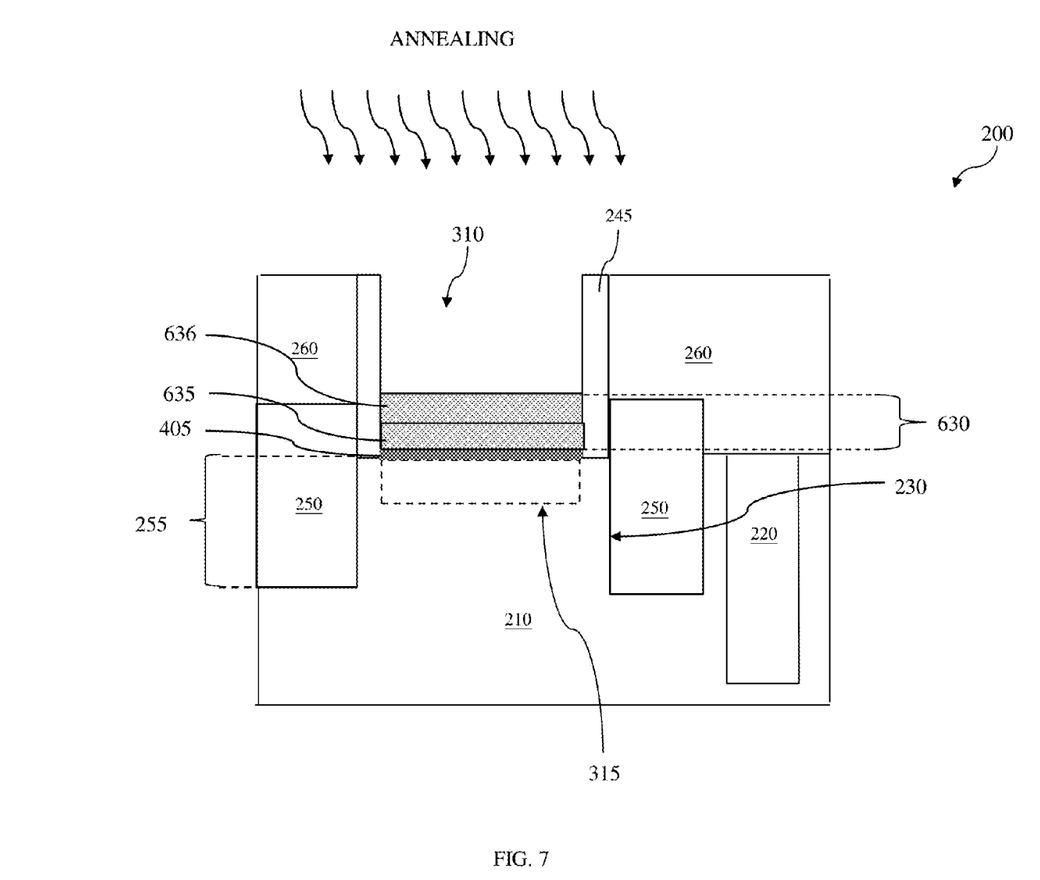

Referring to FIGS. 1 and 7, the method 100 proceeds to step 112 by applying an annealing process to the first HK dielectric layer 410 (with the dopant absorption layer 610) and the second HK dielectric layer 620. The annealing process diffuse dopants 515 from the dopant absorption layer 610 into the first HK dielectric layer 410 further and into the second HK dielectric layer 620. Thus the modified first HK dielectric layer 410 and the modified second HK dielectric layer 620 form a modified HK dielectric stack 630. For the sake of clarity and to better illustrate the concepts of the present disclosure, the modified first and modified second HK dielectric layers, 410 and 620, assigned reference numbers 635 and 636, respectively.

By incorporating with the dopant 515, the modified HK dielectric stack 630 has a third dielectric constant $k_3$ which is different than the first dielectric constant $k_1$ and the second dielectric constant $k_2$. In the present embodiment, the third dielectric constant $k_3$ is greater than the first dielectric constant $k_1$ and the second dielectric constant $k_2$. In one embodiment, the third dielectric constant $k_3$ of the Al doped $HfO_2$ HK dielectric stack 630 is about 30 while both of the first and second dielectric constants, $k_1$ and $k_2$, of the $HfO_2$ layers 410 and 620 are about 15. In the present embodiment, the dielectric constants of the first and second of the HK dielectric layers, 410 and 620, are increased without physical bombardment damage such as being experienced in an implantation process and without process constrains such as limited volatile candidates and cross reaction of precursors in a dopant film deposition.

In present embodiment, the annealing process is conducted in inert gases (e.g., Ar, $N_2$, $N_2$:$H_2$ forming gas) and/or oxidizing ($O_2$, $H_2O$, $N_2O$, NO), and no gases (gas-free) ambient atmosphere. The annealing process may include a rapid thermal anneal (RTA), a laser anneal, and/or a flash lamp anneal. In the present embodiment, the annealing process is performed with a temperature in the range from about 150° C. to about 800° C. and with duration in the range from about one second to about 10 minutes.

Figure 8:
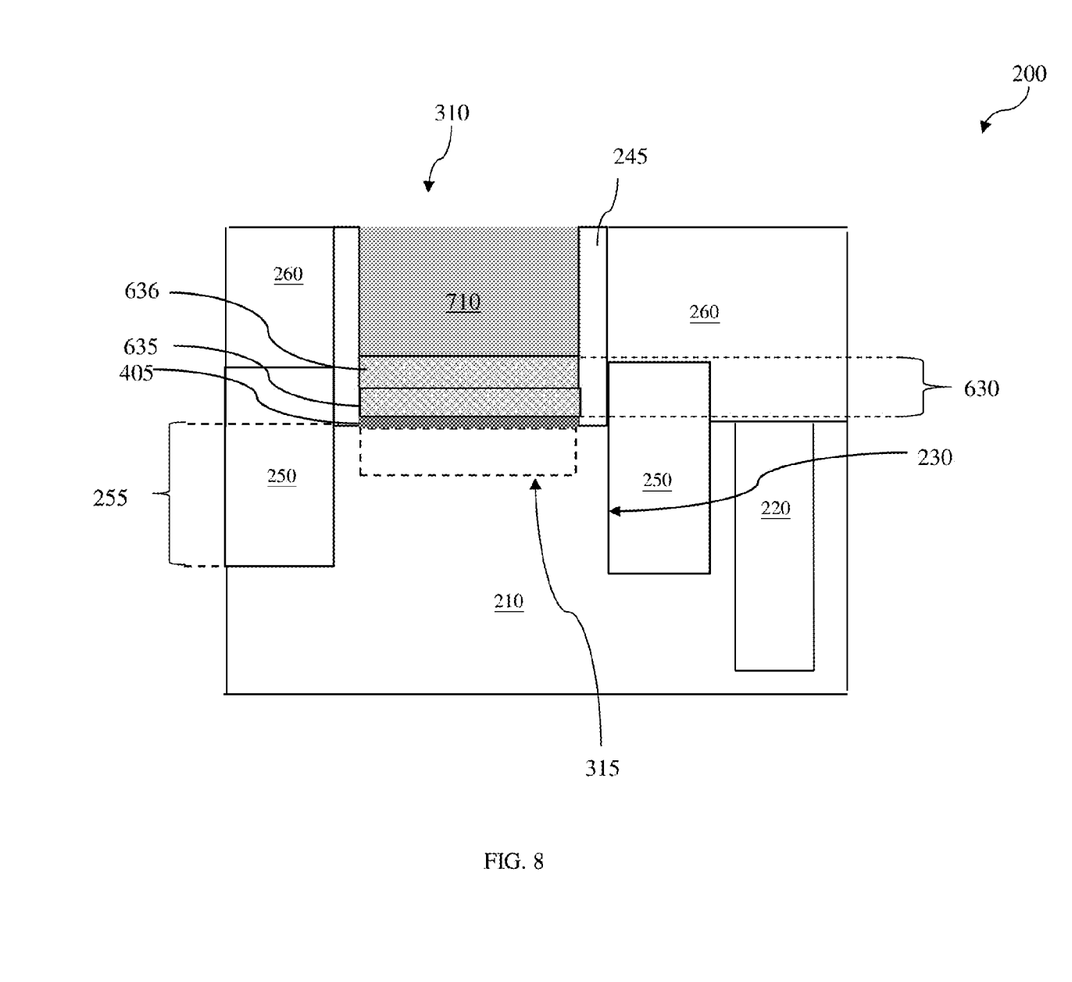

Referring to FIGS. 1 and 8, the method 100 proceeds to step 114 by forming metal gate (MG) electrode 710 over the HK dielectric stack 630. The MG electrode 710 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 710 may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode 710 may be formed by ALD, PVD, CVD, or other suitable process. A CMP process may be performed to remove excessive MG electrode 710. The CMP process provides a substantially planar top surface for the MG electrode 710 and the ILD layer 260.

Additional steps can be provided before, during, and after the method 100, and some of the steps described can be replaced, eliminated, or moved around for additional embodiments of the method 100. Other alternatives or embodiments may present without departure from the spirit and scope of the present disclosure. For example, the second HK dielectric layer 620 is deposited over the first HK dielectric layer 410 after performing the annealing process. For another example, For example, in some embodiment, prior to applying annealing process, another wet-treatment is performed by applying a chemical solution carrying a dopant to the second HK dielectric layer 620 and form a dopant absorption layer as an upper portion of the second HK dielectric layer 620. In some embodiments, the chemical solutions applying to the first and second HK dielectric layers, 410 and 620, are same, as well as dopants carried by these two chemical solutions. In some embodiments, the chemical solutions applying to the first and second HK dielectric layer, 410 and 620, are different, neither dopants carried by these two chemical solutions.

The semiconductor device 200 may undergo further CMOS or MOS technology processing to form various features and regions known in the art. For example, subsequent processing may form various contacts/vias/lines and multilayers interconnect features (e.g., metal layers and interlayer dielectrics) over the substrate 210, configured to connect the various features or structures of the FinFET device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, it can be seen that the present disclosure provides methods of modifying a dielectric constant of a HK dielectric layer by a wet chemical treatment. The method demonstrates a low damage, relaxed process constrains and flexible dopant range process to increase a dielectric constant of a HK dielectric layer.

The present disclosure provides many different embodiments of fabricating a semiconductor device that provide one or more improvements over existing approaches. In one embodiment, a method for fabricating a semiconductor device includes forming a first high-k (HK) dielectric layer over a substrate. The first HK dielectric layer has a first dielectric constant. The method also includes performing a wet treatment process to the first HK dielectric layer and the wet treatment includes a dopant. The method also includes performing an annealing process to the first HK dielectric layer such that the dopant diffuses into the first HK dielectric layer to form a modified HK dielectric layer. Therefore the modified HK dielectric layer has a second dielectric constant which is different than the first dielectric constant.

In another embodiment, a method includes forming a dummy gate stack over a fin feature, removing the dummy gate stack to form a gate trench that exposes a portion of the fin structure, depositing a first high-k (HK) dielectric layer to wrap over the exposed portion of the fin structure in the gate trench. The first HK dielectric layer has a first dielectric constant. The method also includes applying a chemical solution carrying a dopant to the first HK dielectric layer, wherein the dopant is absorbed by the first HK dielectric layer, depositing a second HK dielectric layer over the first HK dielectric layer. The second HK dielectric layer has a second dielectric constant. The method also includes performing an annealing process to the first HK dielectric layer and the second HK dielectric layer such that the dopant diffuses into the first HK dielectric layer and the second HK dielectric layer to form a modified HK dielectric stack. The modified HK dielectric stack has a third dielectric constant which is different than the first dielectric constant and the second dielectric constant.

In yet another embodiment, a method includes forming a dummy gate stack over a fin feature, removing the dummy gate stack to form a gate trench that exposes a portion of the fin structure, depositing a first high-k (HK) dielectric layer to wrap over the exposed portion of the fin structure in the gate trench. The first HK dielectric layer has a first dielectric constant. The method also includes applying a chemical solution carrying a dopant to the first HK dielectric layer. The dopant is absorbed by the first HK dielectric layer. The method also includes depositing a second HK dielectric layer over the first HK dielectric layer. The first HK dielectric layer has a second dielectric constant. The method also includes performing an annealing process to the first HK dielectric layer and the second HK dielectric layer such that the dopant diffuses into the first HK dielectric layer and the second HK dielectric layer to form a modified HK dielectric stack. Therefore the modified HK dielectric stack has a third dielectric constant which is greater than the first dielectric constant and the second dielectric constant. The method also includes forming a metal gate (MG) over the second HK dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
receiving a substrate that includes a pair of sidewall spacers disposed on the substrate;
forming a first high-k (HK) dielectric layer over the substrate such that the first HK dielectric layer is disposed between and physically contacts the pair of sidewall spacers, wherein the first HK dielectric layer has a first dielectric constant;
performing a first wet treatment process to the first HK dielectric layer, wherein the first wet treatment process introduces a first dopant between the pair of sidewall spacers and to the first HK dielectric layer to form a dopant absorption layer in the first HK dielectric layer that extends between and physically contacts the pair of sidewall spacers;
forming a second HK dielectric layer directly on the dopant absorption layer after performing the first wet treatment process to the first HK dielectric layer such that the second HK dielectric layer is disposed between and physically contacts the pair of sidewall spacers, wherein the second HK dielectric layer is formed of a different material than the first HK dielectric layer; and
thereafter, performing an annealing process to the first HK dielectric layer such that the first dopant diffuses from the dopant absorption layer into the first HK dielectric layer to form a modified HK dielectric layer, wherein the modified HK dielectric layer has a second dielectric constant which is different than the first dielectric constant.

2. The method of claim 1, wherein performing the first wet treatment process to the first HK dielectric layer includes applying a chemical solution carrying the first dopant to the first HK dielectric layer; and wherein the first dopant is absorbed by the first HK dielectric layer.

3. The method of claim 1, wherein the second dielectric constant is greater than the first dielectric constant.

4. The method of claim 1, further comprising forming a dummy gate stack over the substrate;
removing the dummy gate stack prior to forming the first HK dielectric layer over the substrate; and
forming a gate electrode over the modified HK dielectric layer.

5. The method of claim 1, wherein the first dopant includes one or more materials selected from the group consisting of $Al(OH)_3$, $Al_2(SO4)_3$, $Al(NO_3)_3$, yttrium (Y), lanthanum (La) and gadolinium (Gd).

6. The method of claim 1, wherein the first dopant is in a chemical solution that includes one or more materials selected from the group consisting of de-ionized water (DIW), isopropyl alcohol (IPA) and organic solvent.

7. The method of claim 1, further comprising applying an oxidizer solution to the first HK dielectric layer, wherein the oxidizer solution includes hydrogen peroxide.

8. A method comprising:
forming a dummy gate stack over a fin structure;
forming sidewall spacers on opposing side surfaces of the dummy gate stack;
removing the dummy gate stack to form a gate trench between the sidewall spacers that exposes a portion of the fin structure;
depositing a first high-k (HK) dielectric layer extending between and physically contacting the sidewall spacers to wrap over a horizontal surface and opposing vertical surfaces of the exposed portion of the fin structure in the gate trench, wherein the first HK dielectric layer has a first dielectric constant;
applying a first liquid chemical solution carrying a first dopant between the sidewall spacers to the first HK dielectric layer, wherein the first dopant is absorbed by the first HK dielectric layer to form a dopant absorption layer extending between and physically contacting the sidewall spacers on a horizontal surface and opposing vertical surfaces of the first HK dielectric layer;
applying an oxidizer to the dopant absorption layer;
after applying the oxidizer, depositing a second HK dielectric layer between the sidewall spacers and on the dopant absorption layer, wherein the second HK dielectric layer has a second dielectric constant, wherein the second HK dielectric layer is formed of a different material than the first HK dielectric layer; and
performing an annealing process to the first HK dielectric layer and the second HK dielectric layer such that the first dopant diffuses from the dopant absorption layer into the first HK dielectric layer and the second HK dielectric layer to form a modified HK dielectric stack, wherein the modified HK dielectric stack has a third dielectric constant which is different than the first dielectric constant and the second dielectric constant.

9. The method of claim 8, further comprising:
after performing the annealing process, forming a metal gate (MG) over the modified HK dielectric stack.

10. The method of claim 8, wherein the first dopant includes one or more materials selected from the group consisting of $Al(OH)_3$, $Al_2(SO4)_3$, $Al(NO_3)_3$, yttrium (Y), lanthanum (La) and gadolinium (Gd).

11. The method of claim 8, wherein the first liquid chemical solution includes one or more materials selected from the group consisting of de-ionized water (DIW), isopropyl alcohol (IPA) and organic solvent.

12. The method of claim 8, further comprising after applying the first liquid chemical solution carrying the first dopant to the first HK dielectric layer, applying an oxidizer solution to the first HK dielectric layer, wherein the oxidizer solution includes hydrogen peroxide.

13. The method of claim 8, wherein the third dielectric constant is greater than the first dielectric constant and the second dielectric constant.

14. A method comprising:
forming a dummy gate stack on a substrate over a fin structure;
forming sidewall spacers on opposing side surfaces of the dummy gate stack;
removing the dummy gate stack to form a gate trench that exposes a portion of the fin structure;
depositing a first high-k (HK) dielectric layer to wrap over the exposed portion of the fin structure in the gate trench, wherein the first HK dielectric layer physically contacts each of the sidewall spacers, and wherein the first HK dielectric layer has a first dielectric constant;
applying a first chemical solution carrying a first dopant between the sidewall spacers to the first HK dielectric layer while the substrate is heated, wherein the first dopant is absorbed by the first HK dielectric layer to form a dopant absorption layer therein that physically contacts each of the sidewall spacers;
after applying the first chemical solution carrying the first dopant to the first HK dielectric layer, depositing a second HK dielectric layer on the dopant absorption layer, wherein the second HK dielectric layer has a second dielectric constant, wherein the second HK dielectric layer is formed of a different material than the first HK dielectric layer;

performing an annealing process to the first HK dielectric layer and the second HK dielectric layer such that the first dopant diffuses from the dopant absorption layer into the first HK dielectric layer and the second HK dielectric layer to form a modified HK dielectric stack, wherein the modified HK dielectric stack has a third dielectric constant which is greater than the first dielectric constant and the second dielectric constant; and forming a metal gate (MG) over the modified HK dielectric stack.

15. The method of claim 14, wherein the first dopant includes one or more materials selected from the group consisting of Al $(OH)_3$, $Al_2(SO4)_3$, $Al(NO_3)_3$, yttrium (Y), lanthanum (La) and gadolinium (Gd).

16. The method of claim 14, wherein the first chemical solution includes one or more materials selected from the group consisting of de-ionized water (DIW), isopropyl alcohol (IPA) and organic solvent.

17. The method of claim 14, further comprising:

after applying the first chemical solution carrying the first dopant to the first HK dielectric layer, applying an oxidizer solution to the dopant absorption layer, wherein the oxidizer solution includes hydrogen peroxide.

18. The method of claim 1, wherein the second HK dielectric layer does not include the first dopant prior to the performing of the annealing process.

19. The method of claim 1, further comprising applying an oxidizer to the dopant absorption layer prior to the forming of the second HK dielectric layer thereupon.

20. The method of claim 1, further comprising heating the substrate during the performing of the first wet treatment process.

* * * * *